United States Patent
Oh et al.

(10) Patent No.: US 7,166,501 B2
(45) Date of Patent: Jan. 23, 2007

(54) METHOD FOR FABRICATING POLYCRYSTALLINE SILICON LIQUID CRYSTAL DISPLAY DEVICE

(75) Inventors: Jae-Young Oh, Gyeonggi-Do (KR); Kyoung-Mook Lee, Seoul (KR); Seong-Hee Nam, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 321 days.

(21) Appl. No.: 10/867,814

(22) Filed: Jun. 16, 2004

(65) Prior Publication Data

US 2005/0009249 A1    Jan. 13, 2005

(30) Foreign Application Priority Data

Jun. 27, 2003   (KR) .................. 10-2003-0042832

(51) Int. Cl.
*H01L 21/00* (2006.01)

(52) U.S. Cl. .................. 438/151; 438/164; 438/166

(58) Field of Classification Search .................. 438/151
See application file for complete search history.

(56) References Cited

U.S. PATENT DOCUMENTS

2002/0105033 A1*   8/2002   Zhang ................... 257/353
2004/0126914 A1*   7/2004   Chang et al. ................ 438/30

FOREIGN PATENT DOCUMENTS

| JP | 4-360581 | 12/1992 |
| KR | 2000-0014192 | 3/2000 |

* cited by examiner

*Primary Examiner*—Jack Chen
(74) *Attorney, Agent, or Firm*—McKenna Long and Aldridge LLP

(57) ABSTRACT

A method of fabricating integral-type LCD devices incorporating polysilicon-type TFTs reduces the number of masks required to fabricate a thin film transistor (TFT). According to the method, a lightly-doped-drain (LDD) type TFT is formed using a single photoresist pattern and a photoresist ashing technique.

15 Claims, 8 Drawing Sheets

METHOD FOR FABRICATING POLYCRYSTALLINE SILICON LIQUID CRYSTAL DISPLAY DEVICE

This application claims the benefit of Korean Patent Application No. 2003-42832, filed on Jun. 27, 2003, which is hereby incorporated by reference for all purposes as if fully set forth herein.

BACKGROUND OF THE INVENTION

1. Field of the Invention

The present invention relates to methods of fabricating liquid crystal display (LCD) devices. More particularly, the present invention relates to a method of fabricating integral-type LCD devices incorporating polysilicon-type thin film transistors (TFTs) using a reduced number of mask processes.

2. Discussion of the Related Art

A liquid crystal display (LCD) device generally consists of a display unit capable of displaying images and a driving circuit unit capable of driving the display unit. As such, LCDs may be classified into one of two groups based on the arrangement of the driving circuit unit and the display unit. Driving circuit units of separated-type LCD devices are connected to the display units by a tape carrier package, etc. Driving circuit units of integral-type LCD devices are formed on the same substrate as structures formed on the substrate of the display units, and simultaneously with the formation of the structures formed on the substrate of the display units. Accordingly, the driving circuit units of integral-type LCD devices can be easier to fabricate than driving circuit units of separated-type LCD devices.

Polysilicon is a material having a higher electron mobility than amorphous silicon. Specifically, amorphous silicon has an electron mobility of 0.1~1 $cm^2$/Vsec while polysilicon, crystallized using an excimer laser, exceeds 100 $cm^2$/Vsec. Therefore, an LCD with a display unit including thin film TFTs having active layers formed of polysilicon, i.e., polysilicon-type TFTs, has a faster response speed than an LCD with a display unit including TFTs with channel layers formed of amorphous silicon, i.e., amorphous-type TFTs. Consequently, LCDs incorporating polysilicon-type TFTs can include more complex circuits and operate at higher speeds than LCDs incorporating amorphous-type TFTs.

FIG. 1 illustrates a schematic view of a related art driving circuit unit of an integral-type LCD device incorporating polysilicon-type TFTs.

Referring to FIG. 1, the driving circuit unit of an integral-type LCD device incorporating polycrystalline-type TFTs consists of a display unit 101 having a plurality of pixels, each comprising a TFT, arranged in a matrix pattern and a driving circuit unit 102 arranged at an peripheral region of the display unit 101 for driving the unit pixels of the display unit 101. The driving circuit unit 102 generally consists of a gate and data drivers 104 and 103, respectively, connected to the unit pixels of the display unit 101, that include p- and n-type TFTs arranged in a complementary metal oxide semiconductor (CMOS) device.

FIGS. 2A to 2I illustrate a related art process of forming an integral-type LCD device incorporating polysilicon-type TFTs.

Referring to FIG. 2A, the related art method of forming an LCD device incorporating polysilicon-type TFTs begins by providing a glass substrate 201 and forming a buffer layer 202 (i.e., an oxidized silicon layer) on the substrate 201 (see FIG. 2A).

Next, an amorphous silicon layer is formed on the buffer layer 202 in a plasma enhanced chemical vapor deposition (PECVD) process at a low temperature followed by a dehydrogenation heat treatment at a temperature of about 400° C. Upon performing the dehydrogenation heat treatment, hydrogen is removed from the amorphous silicon layer to prevent hydrogen within the as-deposited amorphous silicon layer from exploding and damaging the substrate 201 during a subsequently performed crystallization process. The dehydrogenated amorphous silicon layer is then crystallized in a crystallization heat treatment to form a polycrystalline silicon (i.e., polysilicon) layer. One related art process of crystallizing the amorphous silicon layer consists of heating the substrate 201 in an oven. However, the heat involved in this type of crystallization process may deleteriously deform the glass substrate 201. Therefore, another related art process of crystallizing the amorphous silicon layer consists of a laser annealing process. During the laser annealing process, the amorphous silicon layer is quickly melted and allowed to re-solidify. By controlling the temperature gradient within the cooling silicon material, a polysilicon layer having few, but large grains, may be formed. It should be noted that, as the size of the grains increase, the electron mobility of the polysilicon material also increases. After the laser annealing process is performed, the polysilicon layer is dry-etched to define first through third active layers 203a–c (see FIG. 2B), respectively, wherein TFTs of the display unit will be subsequently formed to incorporate the first active layer 203a and TFTs of the driving circuit unit will be subsequently formed to incorporate the second and third active layers 203b and 203c in a CMOS device.

After forming the first through third active layers 203a–c, and with reference to FIG. 2C, a gate insulating layer 204 formed of $SiO_2$ or SiNx, is formed over the entire surface of the substrate 201 to protect the active layers and insulate the active layers from subsequently formed upper layers. Next, a metal layer is formed on the gate insulating layer 204 by a sputtering method and subsequently patterned in a photolithography process to form gate electrodes 205.

Generally, n-type TFTs operate using electrons as charge carriers and, therefore, can generate unacceptable leakage currents. Accordingly, n-type TFTs are beneficially provided as lightly doped drain (LDD)-type TFTs. LDD-type TFTs are formed by implanting n-type impurity ions (e.g., P, As, or other Group V element) into predetermined areas of a source/drain region of an active layer in a low concentration ion implant step (N−) and a high concentration ion implant step (N+).

Referring to FIG. 2D, a first photo mask process (e.g., exposing process, developing process, etc.) is applied to form a first photoresist pattern 206 that shields what will eventually be a p-type TFT region of the driving circuit unit. Next, P ions are implanted at a low concentration into the active layers of what will eventually be n-type TFTs of the driving circuit and display units, wherein gate electrodes 205 exposed by the first photoresist pattern 206 function as an implant mask. Accordingly, a low concentration of n-type ions are implanted into source/drain regions of the first and second active layers 203a and 203b. After the low concentration implant, the first photoresist pattern 206 is removed.

Next, and as shown in FIG. 2E, a second photo mask process is applied to form a second photoresist pattern 207 that shields what will eventually be the p-type TFT as well as the gate electrodes 205 and portions of the source/drain regions of what will eventually be the n-type TFTs. Next, n-type ions are implanted at a high concentration into portions of the first and second active layers 203a and 203b that are exposed by the second photoresist 207, thus forming the n-type TFTs having LDD (low ion concentration) regions 208 and source/drain (high ion concentration) regions 209.

Generally, p-type TFTs operate using holes as charge carriers and, therefore, do not generate leakage currents. Accordingly, p-type TFTs need not be formed as LDD-type TFTs; but, may be formed by implanting p-type impurity ions (e.g., B or other Group III element) into a source/drain region of a active layer.

Referring to FIG. 2F, a second photo mask process is applied to form a third photoresist 210 that exposes only what will eventually be the p-type TFT. Next, B ions are implanted at a high concentration into the active layer of what will eventually be the p-type TFT of the driving circuit unit, wherein the gate electrode 205 exposed by the third photoresist pattern 210 functions as an implant mask. Accordingly, a high concentration of p-type ions are implanted into source/drain regions 211 of the third active layer 203c, thereby forming the p-type TFT. After the high concentration implant, the third photoresist pattern 210 is removed.

Next, and with reference to FIG. 2G, an insulating layer 214 formed of $SiO_2$ or SiNx is deposited on the gate electrodes 205 and contact holes 220 are formed to expose the source/drain regions of the various TFTs. Referring to FIG. 2H, conductive material is be formed within the contact holes 220 to contact the exposed source/drain regions and patterned to form source/drain electrodes 215 and 216.

Referring to FIG. 2I, a passivation layer 217 formed of an organic or inorganic material is deposited over the source/drain electrodes 215 and 216 and a contact hole 219 is formed to expose the drain electrode of the n-type TFT within the display unit. Lastly, a pixel electrode 218 is formed on the passivation layer 217 and within the contact hole 219 to electrically contact the drain electrode 216, thereby completing the LCD device.

The related art process of fabricating integral-type LCD devices incorporating polysilicon-type TFTs described above can be used to produce excellent devices but can be very complicated to perform. Therefore, it would be beneficial to reduce the number of processes required to fabricate integral-type LCD devices incorporating polysilicon-type TFTs.

SUMMARY OF THE INVENTION

Accordingly, the present invention is directed to a method for fabricating integral-type LCDs incorporating polysilicon-type TFTs that substantially obviates one or more of the problems due to limitations and disadvantages of the related art.

Therefore, an advantage of the present invention provides a method of fabricating integral-type LCD devices incorporating polysilicon-type TFTs in a reduced number of steps.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating integral-type LCD devices incorporating polysilicon-type TFTs may, for example, include forming a polysilicon layer on a substrate; forming a gate insulating layer on the polysilicon layer; forming a metal layer on the gate insulating layer; forming a first photoresist pattern on the metal layer; forming a gate electrode using the first photoresist pattern as a mask; patterning the polysilicon layer and the gate insulating layer to form an active layer; removing a portion of the first photoresist pattern to form a second photoresist pattern; implanting impurity ions into the active layers using the second photoresist pattern as a mask; removing a portion of the gate insulating layer formed on the active layer; implanting high concentration impurity ions into the active layer exposed by the removed portions of the gate insulating layer; forming source/drain electrodes on the active layer to contact the high concentration impurity ion implant regions; and forming a pixel electrode electrically connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

FIGS. 3A to 3I illustrate a process of forming an integral-type LCD device incorporating polysilicon-type TFTs in accordance with principles of the present invention.

Figure 1:
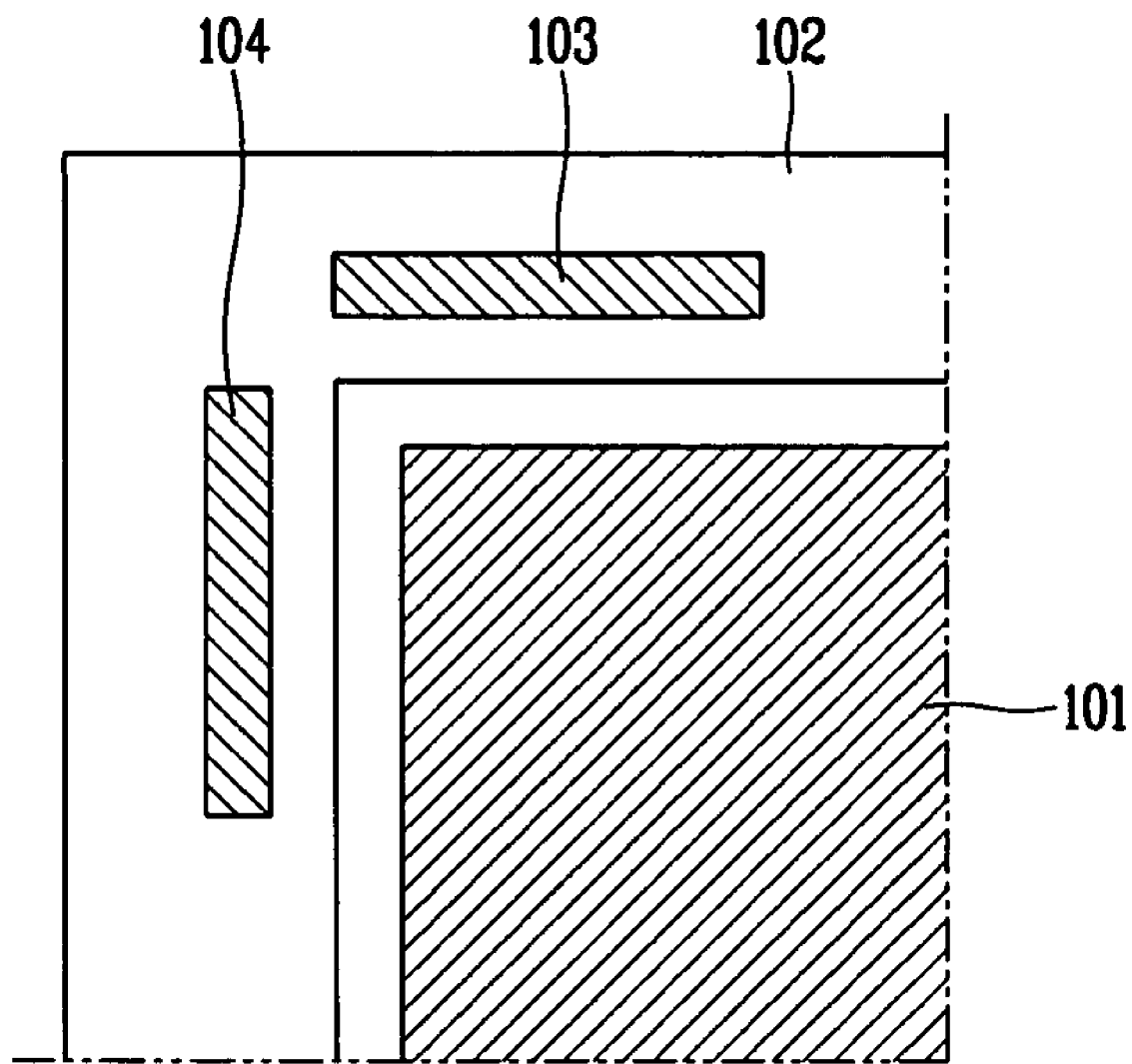
FIG. 1 illustrates a schematic view of a related art driving circuit unit of an integral-type LCD device incorporating polysilicon-type TFTs.
Figure 2A:
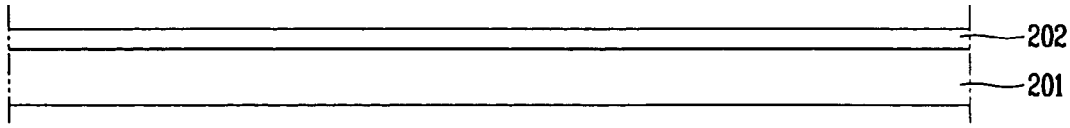
FIGS. 2A to 2I illustrate a related art process of forming an integral-type LCD device incorporating polysilicon-type TFTs.
Figure 2B:
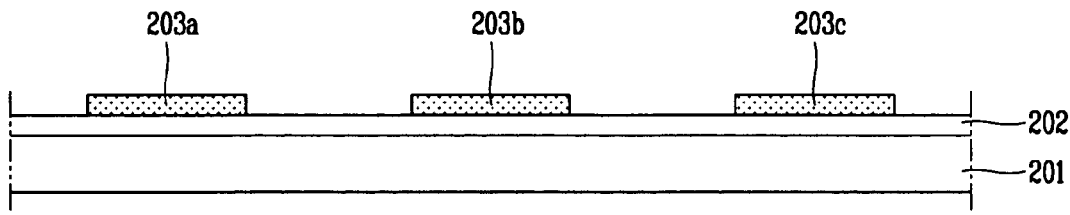
Figure 2C:
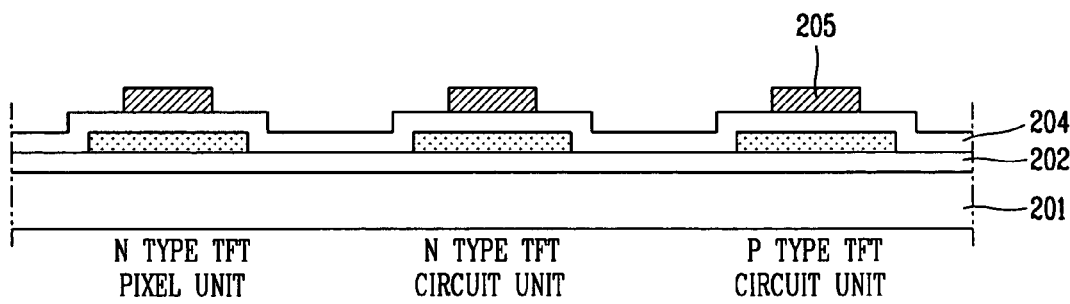
Figure 2D:
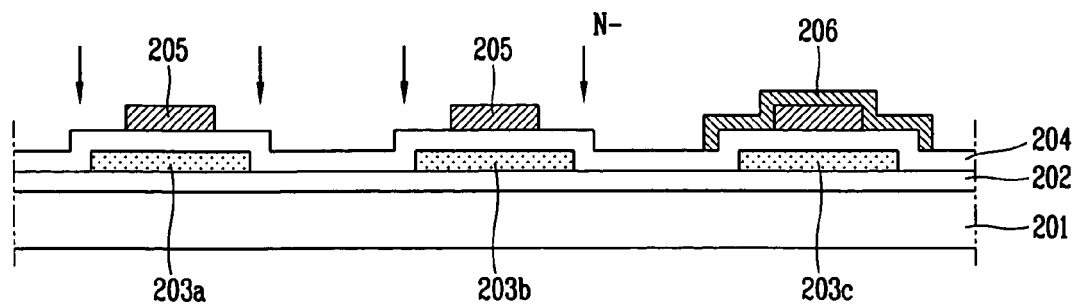
Figure 2E:
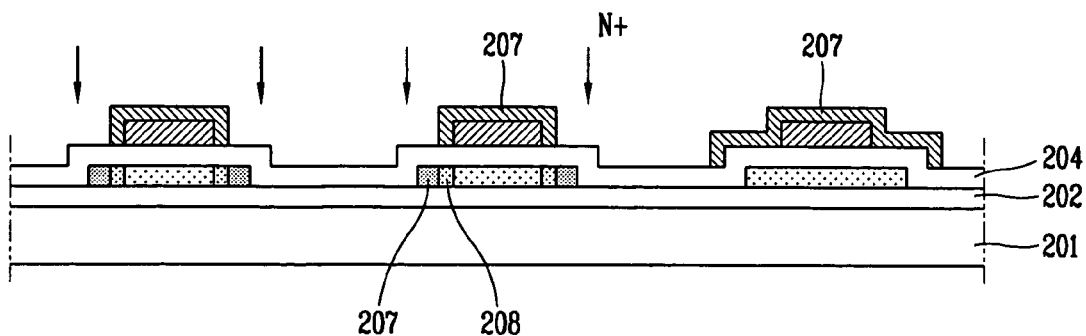
Figure 2F:
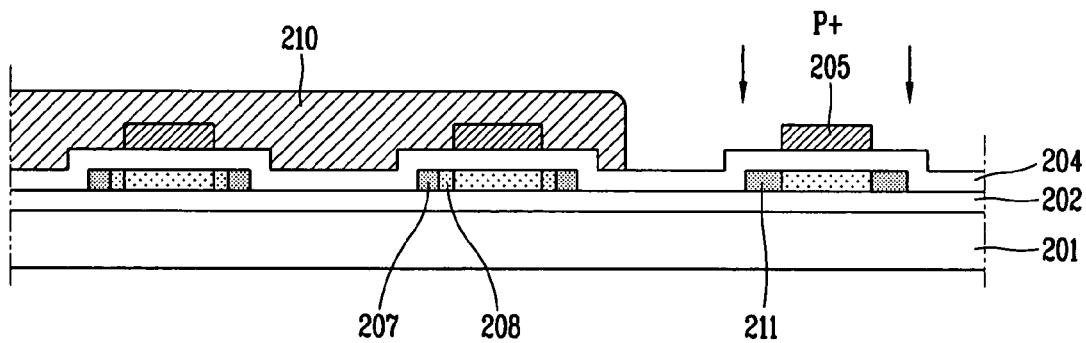
Figure 2G:
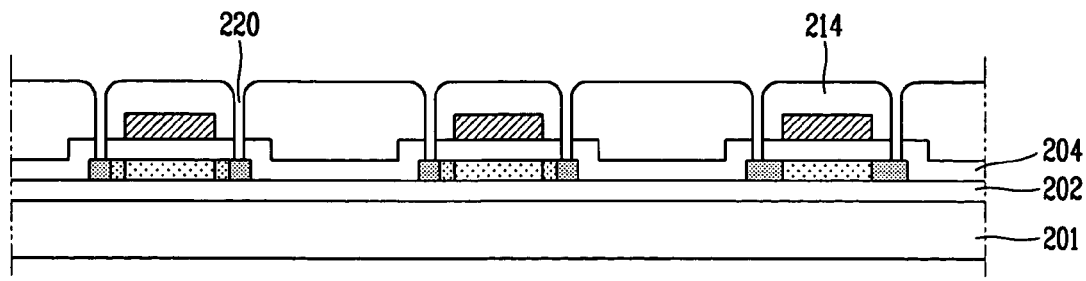
Figure 2H:
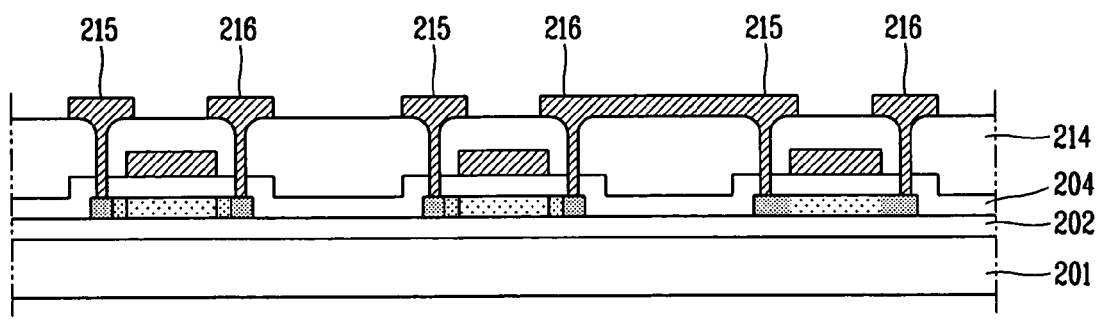
Figure 2I:
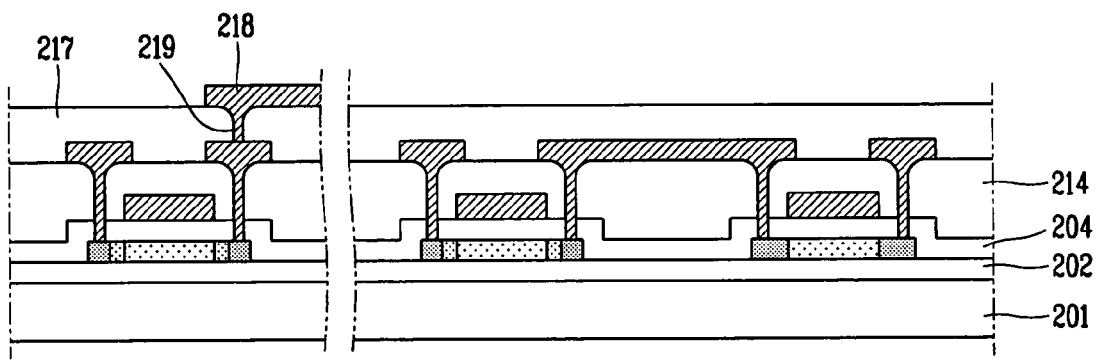
Figure 3A:
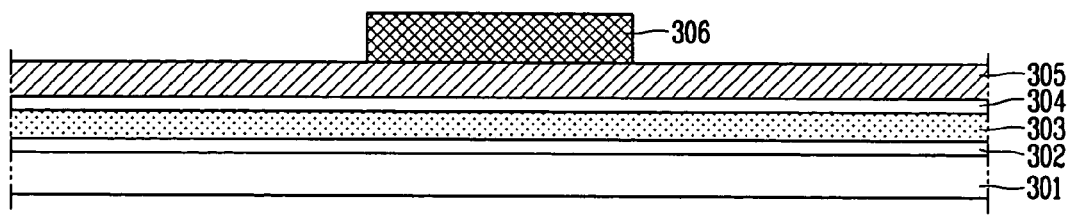
FIGS. 3A to 3I illustrate a process of forming an integral-type LCD device incorporating polysilicon-type TFTs in accordance with principles of the present invention.

Referring to FIG. 3A, a buffer layer 302 may be formed on the substrate 301 to prevent impurities that may exist on the substrate 301 from diffusing into a subsequently formed active layer of a TFT during a subsequently performed crystallization process. In one aspect of the present invention, the buffer layer may, for example, include an oxidized silicon material.

Next, a polysilicon layer 303 may be formed on the buffer layer 302. In one aspect of the present invention, the polysilicon layer may be formed by depositing an amorphous silicon layer on the buffer layer and crystallizing the deposited amorphous silicon layer. In one aspect of the present invention, the deposited amorphous silicon layer may be crystallized in a heat treatment performed using a furnace. In another aspect of the present invention, the deposited amorphous silicon layer may be crystallized in an excimer laser annealing (ELA) treatment upon exposure to an excimer laser to form a polysilicon layer having large grains and, therefore, an electron mobility of greater than 100 cm$^2$/Vsec.

To crystallize the deposited amorphous silicon layer, light from an excimer laser having an high energy density is irradiated onto the surface of the amorphous silicon layer, instantly melting the amorphous silicon material. It should be noted that the aforementioned ELA process does not fully melt the amorphous silicon material. Accordingly, the molten silicon material contains particles of amorphous silicon that act as nucleation sites for the cooling molten silicon material to form the grains which comprise the polysilicon material.

In one aspect of the present invention, the area of grain boundaries between the grains in the polysilicon material may be minimized by performing a sequential lateral solidification (SLS) process on the polysilicon material. In the SLS process, adjacent portions of amorphous silicon material are selectively and sequentially melted using a mask. The portion of the amorphous silicon material shielded by the mask functions as a nucleation site that the molten silicon uses to crystallize as it cools. By performing the SLS process, the leakage current (i.e., the flow of electrons along the grain boundaries of polysilicon material) of the subsequently formed polysilicon-type TFT may be minimized, enabling high-speed and low leakage current TFTs to be formed.

It should be noted, however, while the present invention has been described with reference to ELA and SLS techniques, the polysilicon layer 303 may be formed by substantially any suitable method.

After forming the polysilicon layer 303, a gate insulating layer 304 and a gate metal layer 305 are sequentially formed. In one aspect of the present invention, the gate insulating layer may, for example, include of SiO$_2$ or SiNx. In another aspect of the present invention, the gate metal layer 305 may, for example, include Mo, Al, etc., or alloys or layered combinations thereof. In still another aspect of the present invention, the gate insulating layer 304 may be formed by any suitable method (e.g., plasma enhanced chemical vapor deposition (PECVD), etc.). In yet another aspect of the present invention, the gate metal layer 305 may be formed by any suitable method (e.g., sputtering, etc.).

After forming the gate metal layer 305, a first photoresist pattern 306 may be formed by any suitable photolithographic technique (e.g., deposition, exposure, developing, etc.).

Figure 3B:
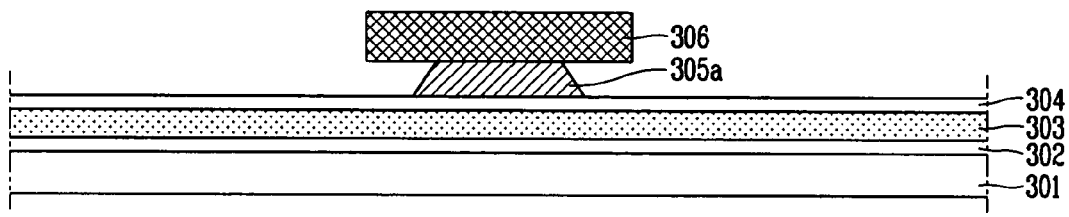

Referring to FIG. 3B, an etch process may be applied to the gate metal layer 305 using the first photoresist pattern 306 as a mask. In one aspect of the present invention, the etch process may comprise a wet- or dry-etch process. For example, where the etch process comprises an isotropic wet-etch, the first photoresist pattern 306 is undercut and the gate metal layer 305 is thus patterned into a tapered gate electrode 305a that is smaller than the first photoresist pattern 306.

Figure 3C:
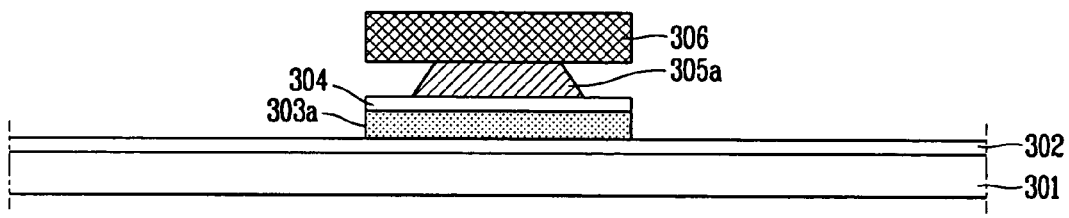

Referring to FIG. 3C, and after the gate electrode 305a is formed, the polysilicon layer 303 and gate insulating layer 304 may be anisotropically etched using the first photoresist pattern 306 as a mask. For example, the polysilicon layer 303 and the gate insulating layer 304 may be dry-etched to have dimensions substantially the same as dimensions of the first photoresist pattern 306. Accordingly, the etched polysilicon layer 303 becomes an active layer 303a having substantially the same dimensions as the first photoresist pattern 306.

Next, the structure shown in FIG. 3C is fabricated into an LDD-type TFT. Accordingly, low and high concentrations of impurity ions may be sequentially implanted into regions corresponding to source/drain regions in a periphery of what will eventually be a channel region of a TFT.

Figure 3D:
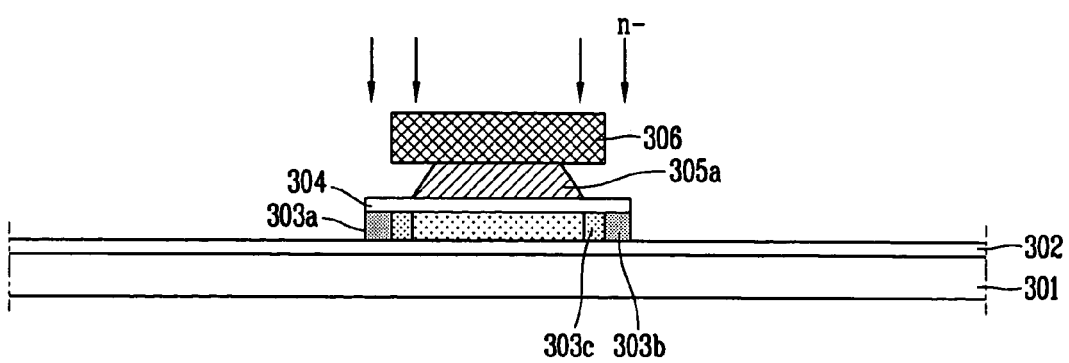

For example, and as shown in FIG. 3D, a predetermined portion of the first photoresist pattern 306 may be removed to form a second photoresist pattern 306a. In one aspect of the present invention, the portion of the first photoresist pattern 306 may be removed in an ashing process wherein the first photoresist pattern 306 is placed within a chamber and exposed to an oxidizing environment. Upon forming the second photoresist pattern 306a, a portion of the active layer 303a, previously shielded by the first photoresist pattern 306, is exposed.

Next, impurity ions may be implanted into the exposed active layer 303a using the second photoresist pattern 306a as a mask. In one aspect of the present invention, an n-type LDD TFT may be formed by implanting n-type ions of Group V elements such as P, and the like, into the active layer 303a.

Accordingly, a first implant may be performed by implanting n-type impurity ions into portions of the active layer 303a exposed by the second photoresist pattern 306a and allowing the implanted impurities to laterally diffuse into LDD portions 303c, wherein LDD portions 303c are adjacent to portions of the active layer 303a that will eventually comprise a channel region. In one aspect of the present invention, the impurity ions associated with the first implant may laterally diffuse into the active layer 303a upon their being implanted therein. Accordingly, LDD regions 303c include a low concentration of first implanted impurity ions.

Figure 3E:
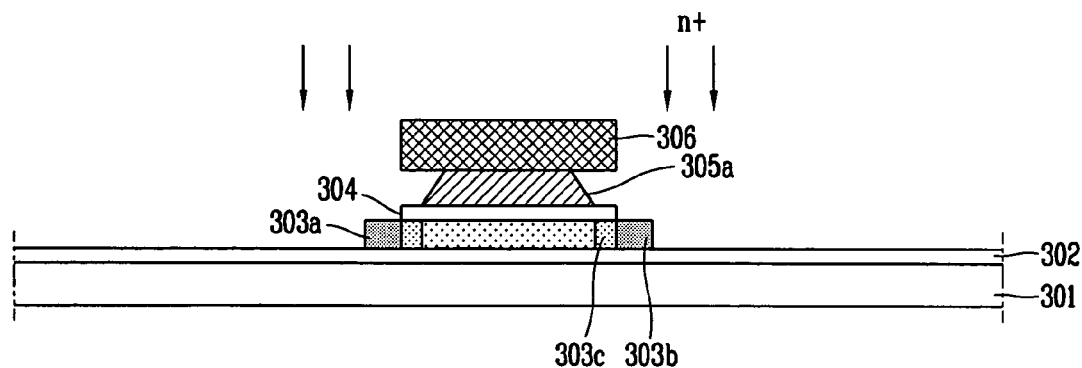

Referring to FIG. 3E, and after performing the first implant, a predetermined portion of the gate insulating layer 304 may be removed using the second photoresist pattern 306a as a mask. In one aspect of the present invention, the predetermined portion of the gate insulating layer 304 may be removed in a dry-etch process to expose portions of the active layer 303a peripheral to the LDD regions 303c. Next, a second implant may be performed by implanting n-type impurity ions directly into portions of the active layer 303a exposed by the gate insulating layer 304. Because the impurity ions associated with the second implant are directly implanted into exposed portions of the active layer 303a, source/drain regions 303b of the active layer 303a may be formed to have a higher concentration of impurities than the LDD regions 303c regions. Upon completion of the second implant, an n-type LDD TFT may be formed and the second photoresist pattern 306a may be completely removed in a photoresist strip/ashing process.

Figure 3F:
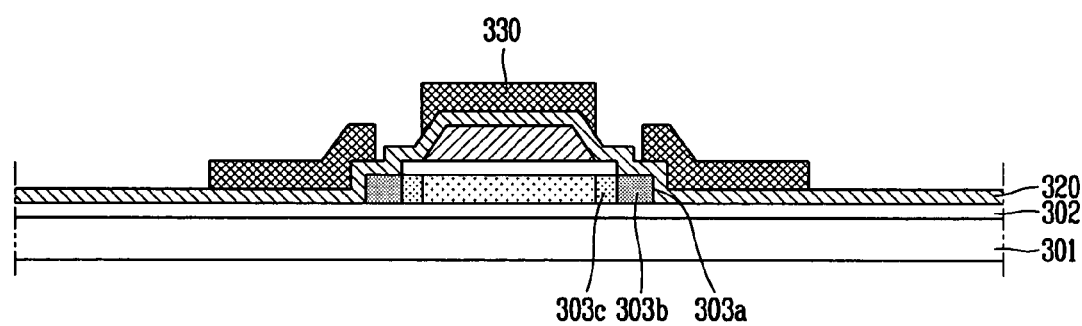
Figure 3G:
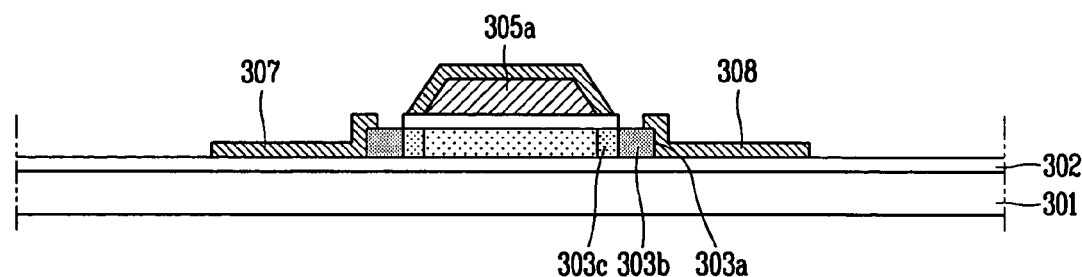

Referring to FIG. 3F, a conductive layer 320 may be deposited over the entire substrate and patterned to form source/drain electrodes 307 and 308 electrically contacted to source/drain region 303c of the active layer 303a. In one aspect of the present invention, the source/drain electrodes 307 and 308 may be patterned by forming a third photoresist pattern 330 using known photolithography techniques. In another aspect of the present invention, the third photoresist pattern 330 may, for example, include a source/drain electrode pattern 330a and gate pattern 330b that exposes predetermined portions of the conductive layer 320 that may be selectively removed (e.g., by dry and/or wet etching techniques) to form the source and drain electrodes 307 and 308 shown in FIG. 3G. After the source/drain electrodes 307 and 308 are formed, the third photoresist pattern 330 may be removed.

Figure 3H:
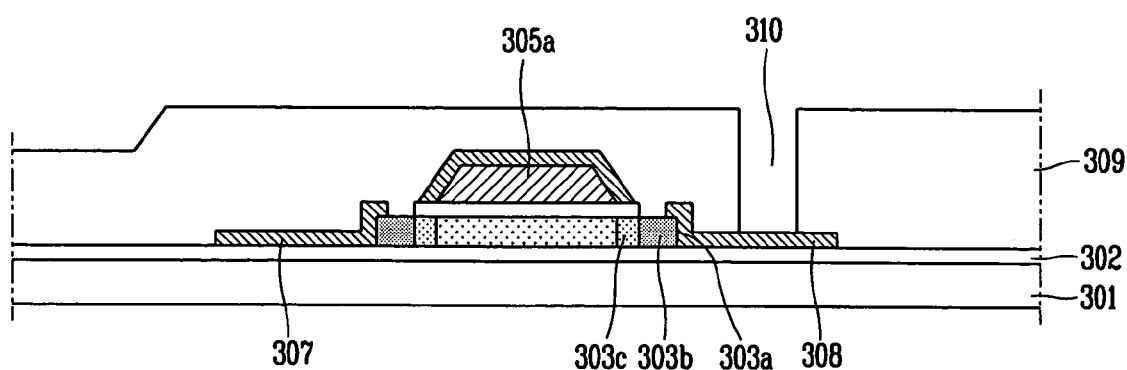

Referring to FIG. 3H, a passivation layer 309 maybe formed on the gate electrode 305a and source/drain electrodes 307 and 308. In one aspect of the present invention, the passivation layer 309 may, for example, include an inorganic material such as $SiO_2$, SiNx, or the like. Subsequently, the passivation layer 309 may be patterned to form contact hole 310, exposing the drain electrode 308. In one aspect of the present invention, the contact hole 310 may be formed by applying known photoresist techniques in conjunction with a fourth photoresist pattern (not shown). After the source/drain electrodes 307 and 308 are formed, the fourth photoresist pattern may be removed.

Figure 3I:
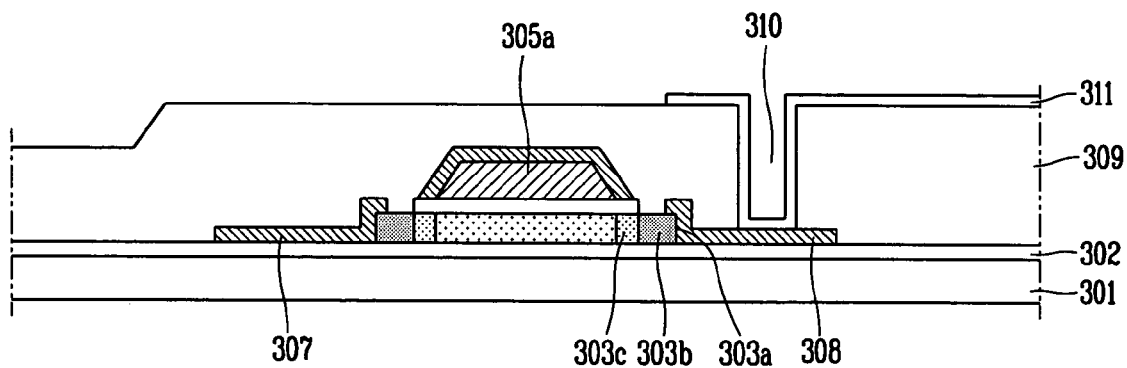

Referring to FIG. 3I, an electrically conductive material may be formed on the passivation layer and within the contact hole 310 and patterned to form a pixel electrode 311 that electrically contacts the drain electrode 308. In one aspect of the present invention, the pixel electrode 311 may, for example, include a material such as indium tin oxide (ITO), or the like. In another aspect of the present invention, the pixel electrode 311 may be patterned using known photolithographic techniques in conjunction with a fifth photoresist pattern (not shown). After the pixel electrode 311 is formed, the fifth photoresist pattern may be removed. It should be noted that the present invention requires only four photoresist patterns (i.e., the first, third, fourth, and fifth photoresist patterns) to be individually formed and removed.

Figure 4A:
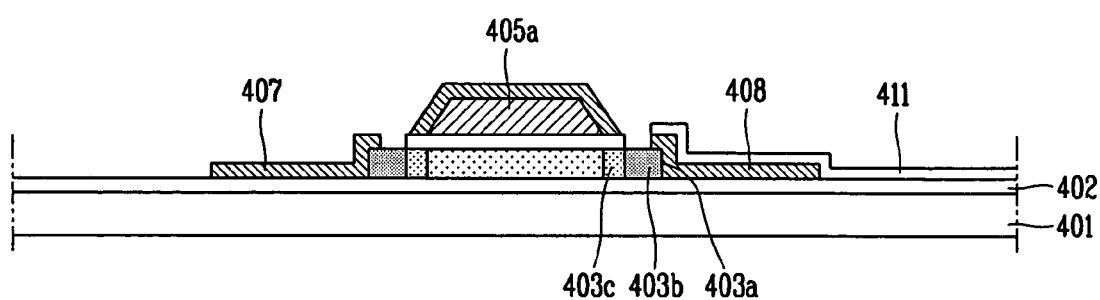
FIGS. 4A and 4B illustrate a process of forming an integral-type LCD device incorporating polysilicon-type TFTs in accordance with other principles of the present invention.
Figure 4B:
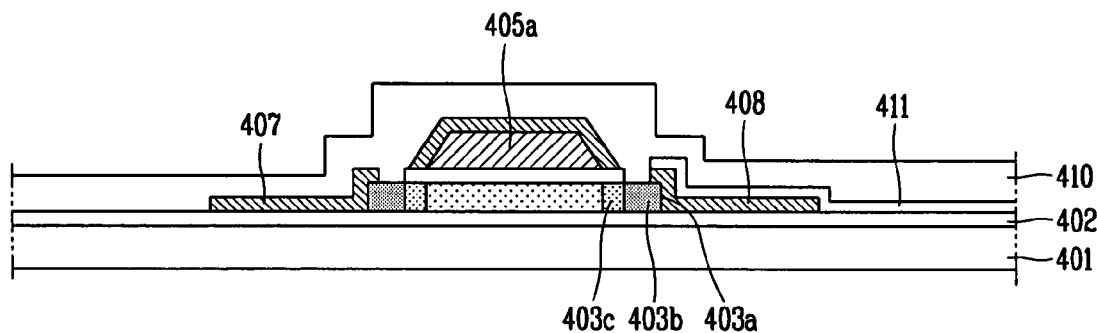

FIGS. 4A and 4B illustrate a process of forming an integral-type LCD device incorporating polysilicon-type TFTs in accordance with other principles of the present invention.

According to the principles of the present invention described with reference to FIGS. 4A and 4B, the number of photoresist patterns required may be reduced by one by forming a pixel electrode directly on the drain electrode. For discussion purposes only, it may be assumed that FIGS. 4A and 4B illustrate methods of fabricating TFTs that replace the methods of fabricating TFTs illustrated in FIGS. 3H and 3I. Accordingly, reference numerals 301 and 401 may designate a substrate, reference numerals 302 and 402 may designate a buffer layer, etc.

Referring to FIG. 4A, an electrically conductive material may be formed on entire substrate 401 including the gate electrode 405a, the source electrode 407, the drain electrode 408, etc, and patterned to form a pixel electrode 411 that electrically contacts the drain electrode 408. In one aspect of the present invention, the pixel electrode 411 may, for example, include a material such as indium tin oxide (ITO), or the like. In another aspect of the present invention, the pixel electrode 411 may be patterned using known photolithographic techniques in conjunction with a sixth photoresist pattern (not shown).

According to principles of the present invention, the pixel electrode 411 may be patterned using an etching process. In one aspect of the present invention, the etching process may be implemented as a wet-etching technique. In another aspect of the present invention, the wet-etching technique may employ an etchant such as oxylic acid, or the like, capable of etching the material forming the pixel electrode 411 selectively with respect to the materials forming the active layer 403a, the gate electrode 405a, and the source/drain electrodes 407 and 408.

Referring to FIG. 4B, and after the pixel electrode 411 is formed, a passivation layer 410 may be formed over the substrate to protect the thus formed TFT. In one aspect of the present invention, the passivation layer 410 may, for example, include suitably a transparent insulating material.

As is known, the aforementioned photolithography processes involve many sub-processes such as photoresist deposition, exposure, development, etching, cleaning, etc. Therefore, developing methods of fabricating complex structures with a reduced number of photolithographic processes is extremely beneficial. According to principles of the present invention described above, only a single photoresist process need be employed to form the doped impurity regions (i.e., the LDD, source, and drain regions) required by n-type LDD TFTs, thereby minimizing the number of individual photolithographic processes that must be performed to form the TFT device, reducing fabrication cost, and increasing product yield.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a thin film transistor in a liquid crystal display (LCD) device, comprising:
    forming a polysilicon layer on a substrate;
    forming a gate insulating layer on the polysilicon layer;
    forming a metal layer on the gate insulating layer;
    forming a first photoresist pattern on the metal layer;
    patterning the metal layer into a gate electrode using the first photoresist pattern as a mask;
    patterning the polysilicon layer and the gate insulating layer to form an active layer;
    removing a portion of the first photoresist pattern thereby forming a second photoresist pattern;
    firstly implanting impurity ions into the active layer using the second photoresist pattern as a mask;
    removing a portion of the gate insulating layer formed on the active layer after said firstly implanting impurity ions into the active layer;
    secondly implanting impurity ions at a high concentration into the active layer exposed by removing the gate insulating layer;
    forming a source/drain electrode on a portion of the active layer implanted with the high concentration of impurity ions; and
    forming a pixel electrode electrically contacting the drain electrode.

2. The method of claim 1, further including forming a buffer layer on the substrate prior to forming the polysilicon layer.

3. The method of claim 1, wherein the step for forming the polysilicon layer comprises:
    forming an amorphous silicon layer on the substrate; and
    crystallizing the amorphous silicon layer.

4. The method of claim 3, wherein the crystallizing includes annealing the amorphous silicon layer.

5. The method of claim 4, wherein the annealing includes irradiating light from an excimer laser onto the amorphous silicon layer.

6. The method of claim 1, wherein patterning the metal layer includes undercutting the first photoresist pattern such that the gate electrode is smaller than the first photoresist pattern.

7. The method of claim 6, wherein patterning the metal layer includes wet-etching the metal layer.

8. The method of claim 1, wherein removing a portion of the first photoresist pattern includes ashing the first photoresist pattern.

9. The method of claim 1, wherein patterning the polysilicon layer and gate insulating layer includes dry-etching the polysilicon layer and the gate insulating layer by applying the first photoresist pattern as a mask.

10. The method of claim 1, wherein firstly implanting impurity ions includes forming LDD region within the active layer.

11. The method of claim 10, wherein the LDD region is formed by diffusion of the firstly implanted impurity ions.

12. The method of claim 1, wherein removing a portion of the gate insulating layer includes dry-etching the gate insulating layer using the second photoresist pattern as a mask.

13. The method of claim 1, wherein the second photoresist pattern is larger than the gate electrode.

14. The method of claim 1, wherein forming the pixel electrode includes:
  forming a passivation layer on the source/drain electrode;
  forming a contact hole within the passivation layer, wherein the contact hole exposes the drain electrode; and
  forming a pixel electrode within the contact hole to electrically contact the drain electrode.

15. The method of claim 1, wherein the firstly implanted impurity ions include atoms of a Group V element.

* * * * *